United States Patent
Behrends et al.

(10) Patent No.: US 8,578,304 B1
(45) Date of Patent: Nov. 5, 2013

(54) IMPLEMENTING MULITPLE MASK LITHOGRAPHY TIMING VARIATION MITIGATION

(75) Inventors: Derick G. Behrends, Rochester, MN (US); Todd A. Christensen, Rochester, MN (US); Travis R. Hebig, Rochester, MN (US); Michael Launsbach, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/558,468

(22) Filed: Jul. 26, 2012

(51) Int. Cl.
*G06F 17/50* (2006.01)

(52) U.S. Cl.
USPC ............. 716/51; 716/108; 716/111; 716/113; 716/134

(58) Field of Classification Search
USPC .............................. 716/50, 51, 52, 53, 54, 55
See application file for complete search history.

(56) References Cited

U.S. PATENT DOCUMENTS

| | | | |
|---|---|---|---|
| 7,627,836 B2 | 12/2009 | Culp et al. | |
| 8,082,524 B2 | 12/2011 | Gleason et al. | |
| 8,151,224 B1 | 4/2012 | Ang et al. | |
| 2003/0121013 A1* | 6/2003 | Moon et al. | 716/6 |
| 2004/0031007 A1* | 2/2004 | Hirakimoto et al. | 716/8 |
| 2006/0150132 A1* | 7/2006 | Gupta | 716/5 |
| 2007/0292774 A1 | 12/2007 | Ke et al. | |
| 2008/0052653 A1 | 2/2008 | Tuncer et al. | |
| 2011/0010680 A1 | 1/2011 | Vuillod et al. | |
| 2011/0197168 A1 | 8/2011 | Chen et al. | |
| 2012/0089953 A1 | 4/2012 | Baum et al. | |

OTHER PUBLICATIONS

"Multiple Imaging of a Single Positive Resist Layer", by Robinson, JA IBM TDB, IPCOM000039336D, Feb. 1, 2005.
Method for improving mask defect yield using multipass wafer exposures, Disclosed Anonymously, IBM TDB, IPCOM000022274D, Mar. 3, 2004.
"Method for adjusting circuit topology dependent on process measurement", Disclosed Anonymously, IBM TDB, IPCOM0000159622D, Oct. 22, 2007.

* cited by examiner

*Primary Examiner* — Nha Nguyen
*Assistant Examiner* — Brian Ngo
(74) *Attorney, Agent, or Firm* — Joan Pennington

(57) ABSTRACT

A method, system and computer program product are provided for implementing multiple mask lithography timing variation mitigation for a multiple mask polysilicon (PC) process. An application specific integrated circuit (ASIC) library includes at least one circuit device for a first mask, and at least one circuit device for a second mask. Critical hold time paths and critical setup time paths are identified in a circuit design. For critical hold time paths, circuit devices in the critical hold time paths are placed on a single mask of either the first mask or the second mask. For critical setup time paths, path delays are reduced by providing a mixture of circuit devices on the first mask and the second mask.

17 Claims, 10 Drawing Sheets

500

510

IMPLEMENTING MULITPLE MASK LITHOGRAPHY TIMING VARIATION MITIGATION

FIELD OF THE INVENTION

The present invention relates generally to the data processing field, and more particularly, relates to a method, system and computer program product for implementing multiple mask lithography timing variation mitigation.

DESCRIPTION OF THE RELATED ART

The emergence of multiple mask lithography for polysilicon is due to the difficulty of printing on very tight pitches. In integrated circuit design of modern chips having very small lithography, such as 14 nm, more than one mask, and therefore more than one exposure on a level is required to produce shapes on the level.

The use of multiple mask lithography introduces tracking differences between devices created using a first mask relative to devices created on a second mask. On logic paths where hold times are a concern, very tight tracking is required.

By introducing this multiple mask polysilicon (PC) process, variation between polysilicon (PC) fingers is increased. When two timing paths are related, for example, via a setup or hold test, additional margin must be added to the timing computation to account for the unintentional possibility of having more than one circuit path on one mask as compared to another mask. Adding margin to account for mask variation typically is required in a multiple mask PC process. Otherwise, without adding margin to account for mask variation; dead hardware or reduced performance likely may result.

A need exists for an efficient and effective mechanism to implement enhanced multiple mask lithography timing variation mitigation in the design of an integrated circuit chip.

SUMMARY OF THE INVENTION

A principal aspect of the present invention is to provide a method, system and computer program product for implementing multiple mask lithography timing variation mitigation. Other important aspects of the present invention are to provide such method, system, and computer program product substantially without negative effects and that overcome many of the disadvantages of prior art arrangements.

In brief, a method, system and computer program product are provided for implementing multiple mask lithography timing variation mitigation for a multiple mask polysilicon (PC) process. An application specific integrated circuit (ASIC) library includes at least one circuit device for a first mask, and at least one circuit device for a second mask. Critical hold time paths and critical setup time paths are identified in a circuit design. For critical hold time paths, circuit devices in the critical hold time paths are placed on a single mask of either the first mask or the second mask. For critical setup time paths, path delays are reduced by providing a mixture of circuit devices on the first mask and the second mask.

In accordance with features of the invention, the critical hold time paths must track closely and for any given hold time miss, each path and all the associated logic involved with the miss are put on either the first mask or the second mask. When there are common paths between different hold time misses, then each of the common paths and all the associated logic are put on the same mask, which is either the first mask or the second mask. When all devices in each of the common paths and all the associated logic are on the same mask the variation margin penalty is removed.

In accordance with features of the invention, for hold time timing between a two path race, extra timing margin is required to be added to ensure the race will be won correctly. By ensuring that both paths in a race condition are on the same polysilicon (PC) mask, then less timing margin is required to ensure the race is won correctly.

In accordance with features of the invention, for critical setup time paths where delay needs to be minimized, a mix of both masks is selected. This improves the timing of the paths because the probability that both mask phases vary to make the paths slow is less than the probability that a single mask phase would vary. For example, for each path and all the associated logic, an even distribution or even split between the first mask or the second mask is selected.

In accordance with features of the invention, the ASIC library minimizes the layout impact of having circuits on two or more different masks.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, system and computer program product are provided for implementing multiple mask lithography timing variation mitigation of an integrated circuit design.

In accordance with features of the invention, for hold time timing between a two path race, extra timing margin is required to be added to ensure the race will be won correctly. By ensuring that both paths in a race condition are on the same polysilicon (PC) mask in accordance with the method of the invention, then less timing margin is required to ensure the race is won correctly. For setup time paths where delay needs to be minimized, the method of the invention selects a mix of both mask phases. This improves the timing of the paths because the probability that both mask phases vary to make the paths slow is less than the probability that a single mask phase would vary. This gives a tighter overall sigma distribution and allows the timing methodology to remove a proportion of this timing penalty.

Figure 1:
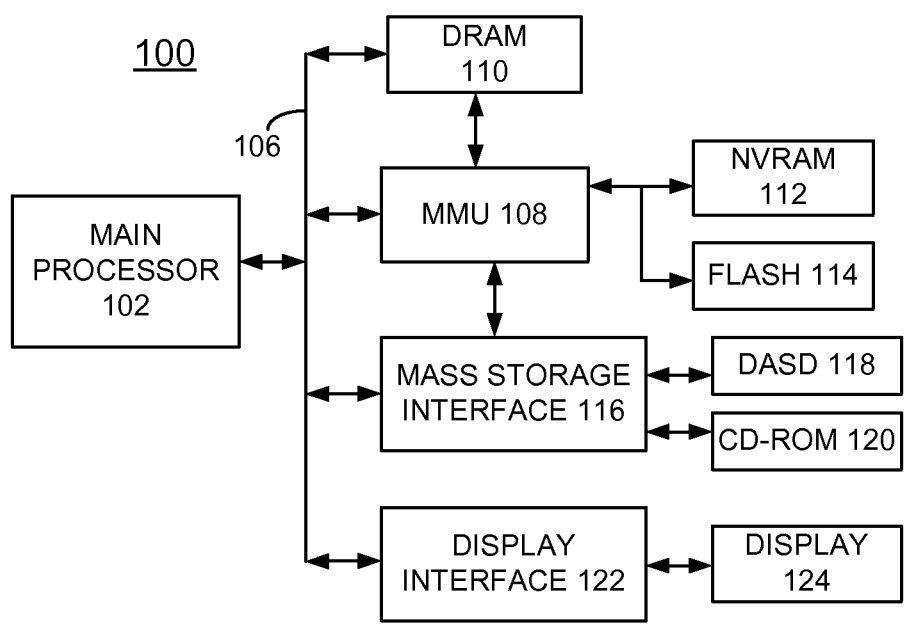
FIGS. 1 and 2 are block diagram representations illustrating an example computer system and operating system for implementing multiple mask lithography timing variation mitigation of an integrated circuit chip in accordance with the preferred embodiment.
Figure 2:
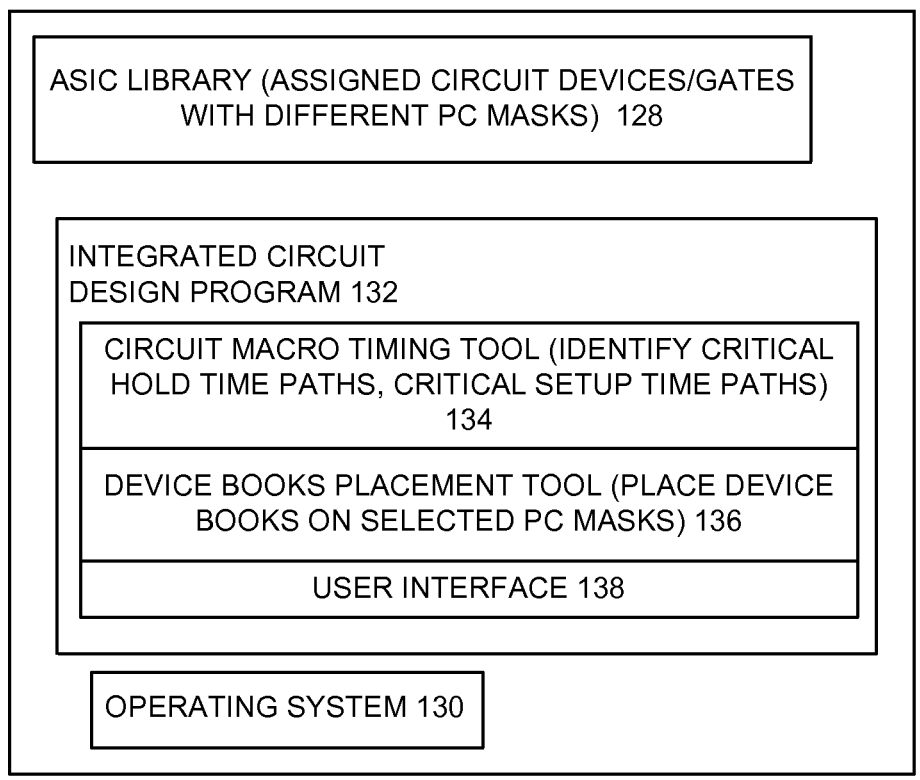

Referring now to the drawings, in FIGS. 1 and 2 there is shown a computer system generally designated by the reference character 100 for implementing multiple mask lithography timing variation mitigation of an integrated circuit in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 coupled to the system bus 106 and connected to a display 124.

As shown in FIG. 2, computer system 100 includes an application specific integrated circuit (ASIC) library 128 of the preferred embodiment with assigned circuit devices or gates with different polysilicon (PC) masks, including at least one circuit device for a first mask, and at least one circuit device for a second mask. Computer system 100 includes an operating system 130, an integrated circuit design program 132, an circuit macro timing tool 134 to identify critical hold time paths and critical setup time paths in an integrated circuit or chip, a device book placement program or tool 136 placing books with a selected PC mask of the preferred embodiment, and a user interface 138. The ASIC library 128 is provided to minimize the layout impact of having circuits on two or more different PC masks in accordance with the preferred embodiment.

Various commercially available computers can be used for computer system 100, for example, an IBM server computer. CPU 102 is suitably programmed by the integrated circuit design program 132, the chip timing tool 134 and the gate phase device placement program 136 to execute the flowcharts of FIGS. 3A and 3B for implementing multiple mask lithography timing variation mitigation in accordance with the preferred embodiment.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors.

In accordance with features of the invention, the device book placement program or tool 136 placing books with a selected PC mask of the integrated circuit using the results of a timing simulation tool 134, the tightest paths are selectively picked to effectively eliminate the multiple mask timing margin required, thereby improving the overall timing of the circuit or chip. Critical hold time paths and critical setup time paths are identified by the circuit macro timing tool 134 in a circuit design. For critical hold time paths, circuits in the critical hold time paths are placed on the same mask. For critical setup time paths, path delays are reduced by providing a mixture of the first mask circuit devices and the second mask circuit devices.

Figure 3A:
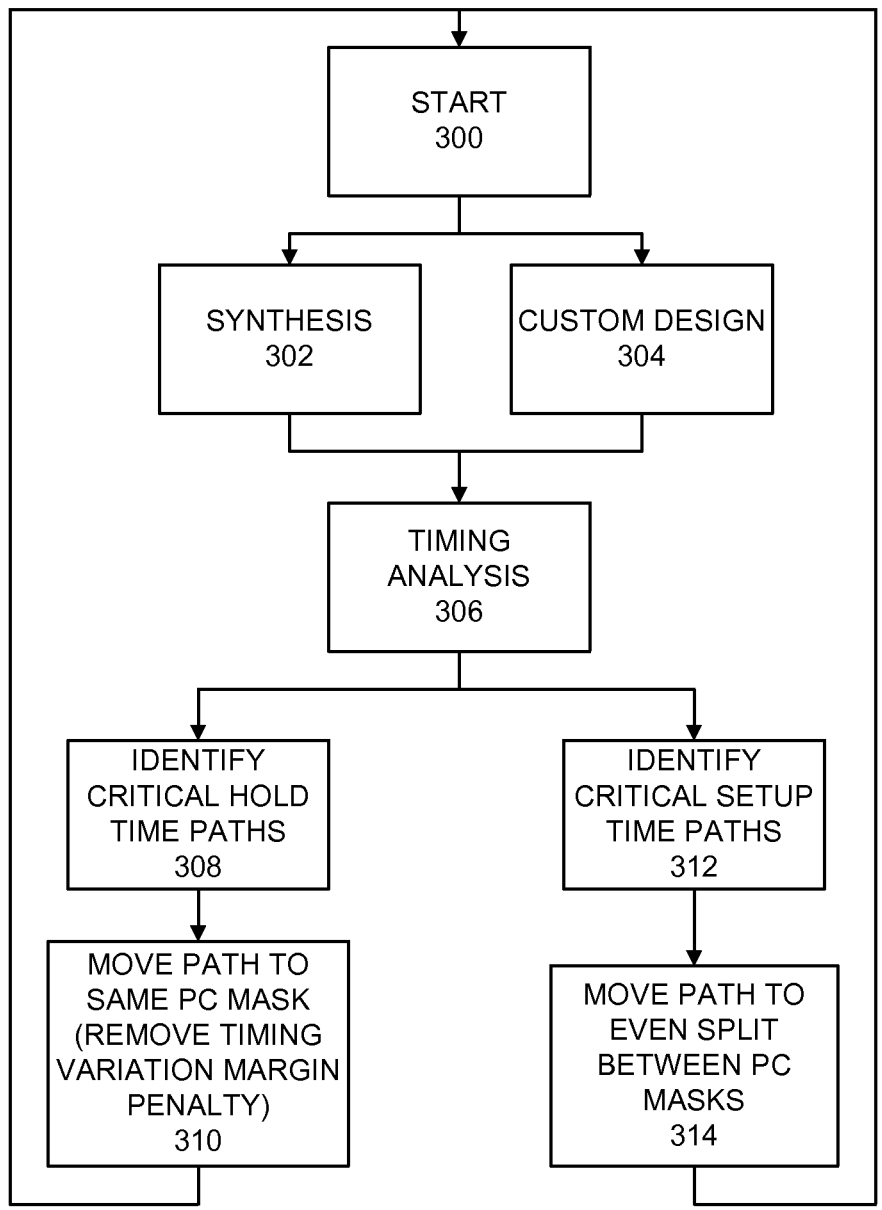
FIGS. 3A and 3B are flow charts illustrating exemplary steps for implementing multiple mask lithography timing variation mitigation in accordance with the preferred embodiment.

Referring to FIG. 3A, there are shown example steps for implementing multiple mask lithography timing variation mitigation in accordance with the preferred embodiment starting at a block 300. Synthesis of a circuit macro of an integrated circuit design is provided as indicated at a block 302 or a custom design of a circuit macro of an integrated circuit design is provided as indicated at a block 304. The circuit macro timing tool 134 is run performing timing analysis on the circuit macro of an integrated circuit design as indicated at a block 306.

As indicated at a block 308, critical hold time paths are identified. As indicated at a block 310, the identified hold time paths are moved to the same PC mask. For the identified hold time paths including any given hold time miss, each path and all the associated logic involved with the miss is put on a single phase, for example, selected as either mask A library or mask B library. Each of the common paths and all the associated logic are put on the same mask, which is either the first PC mask or the second PC mask. When all devices in each of the common paths and all the associated logic are on the same PC mask the variation margin penalty advantageously is removed at block 310. This can potentially fix many critical paths on the chip with minimal redesign effort.

As indicated at a block 312, critical setup time paths are identified. As indicated at a block 314, the identified setup time paths are moved to provide an even distribution or even split between the PC masks. For critical setup time paths where delay needs to be minimized, a mix of the different PC masks is selected. This improves the timing of the paths, for example, because the probability that both PC mask phases vary to make the paths slow is less than the probability that a single mask phase would vary. For example, for each path and all the associated logic, an even distribution or even split between the first mask and the second mask is selected.

Then the operations return to block 300 and operations are repeated with the circuit macro timing tool 134 is run again performing timing analysis on the new layout for the integrated circuit design.

Figure 3B:
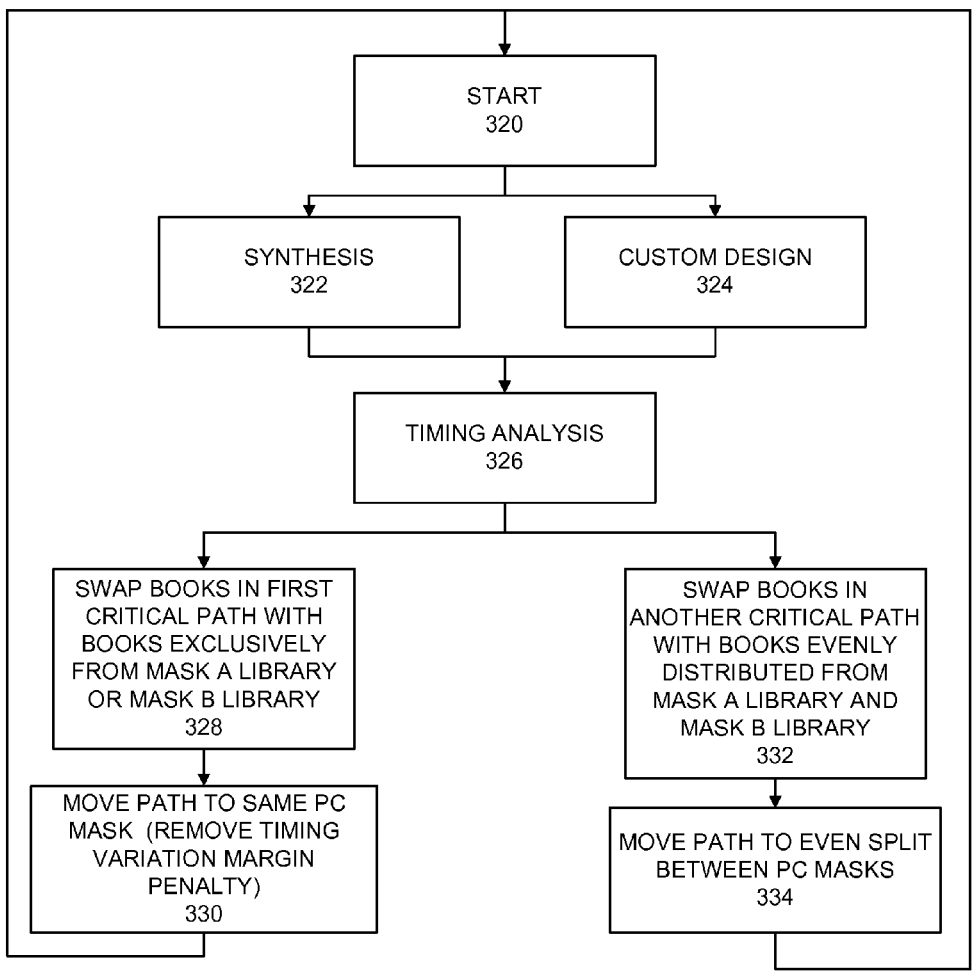

Referring to FIG. 3B, there are shown further example steps for implementing multiple mask lithography timing variation mitigation in accordance with the preferred embodiment starting at a block 320. Synthesis of a circuit macro of an integrated circuit design is provided as indicated at a block 322 or a custom design of a circuit macro of an integrated circuit design is provided as indicated at a block 324. The circuit macro timing tool 134 is run performing timing analysis on the circuit macro of an integrated circuit design as indicated at a block 326.

As indicated at a block 328, books in an identified path such as a critical hold time path are swapped with books exclusively from either a PC mask A library or a PC mask B library. As indicated at a block 330, the identified path is moved to the same PC mask. For the identified path, the path and all the associated logic books are put on a single mask or phase, for example, selected as either the PC mask A library or the PC mask B library, and a timing variation margin penalty is removed for the identified path at block 330.

As indicated at a block 332, books in another identified path such as a critical setup time path are swapped to evenly distribute books from the mask A library and the mask B library. As indicated at a block 330, the identified path is moved to provide an even distribution or even split between the PC masks.

Then the operations return to block 320 and operations are repeated where the circuit macro timing tool 134 is run again performing timing analysis on the new layout for the integrated circuit design.

Figure 4A:
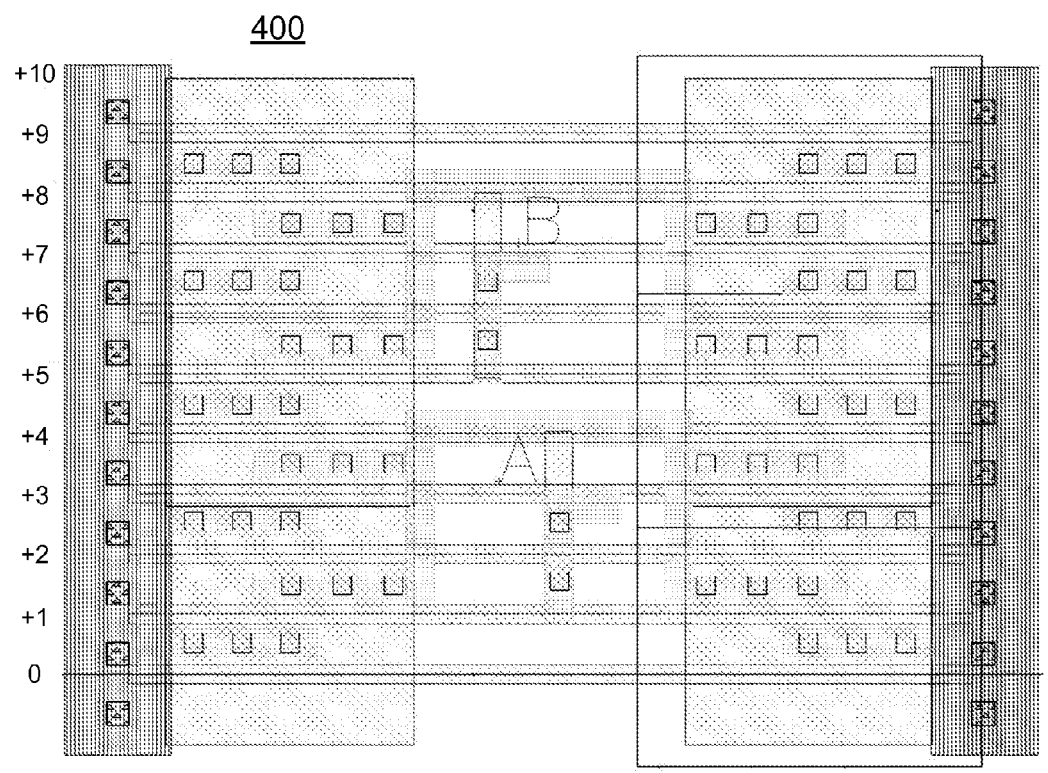
FIGS. 4A, 4B and 4C respectively illustrate exemplary circuit library layout books for example inverters for implementing multiple mask lithography timing variation mitigation in accordance with the preferred embodiment.
Figure 4B:
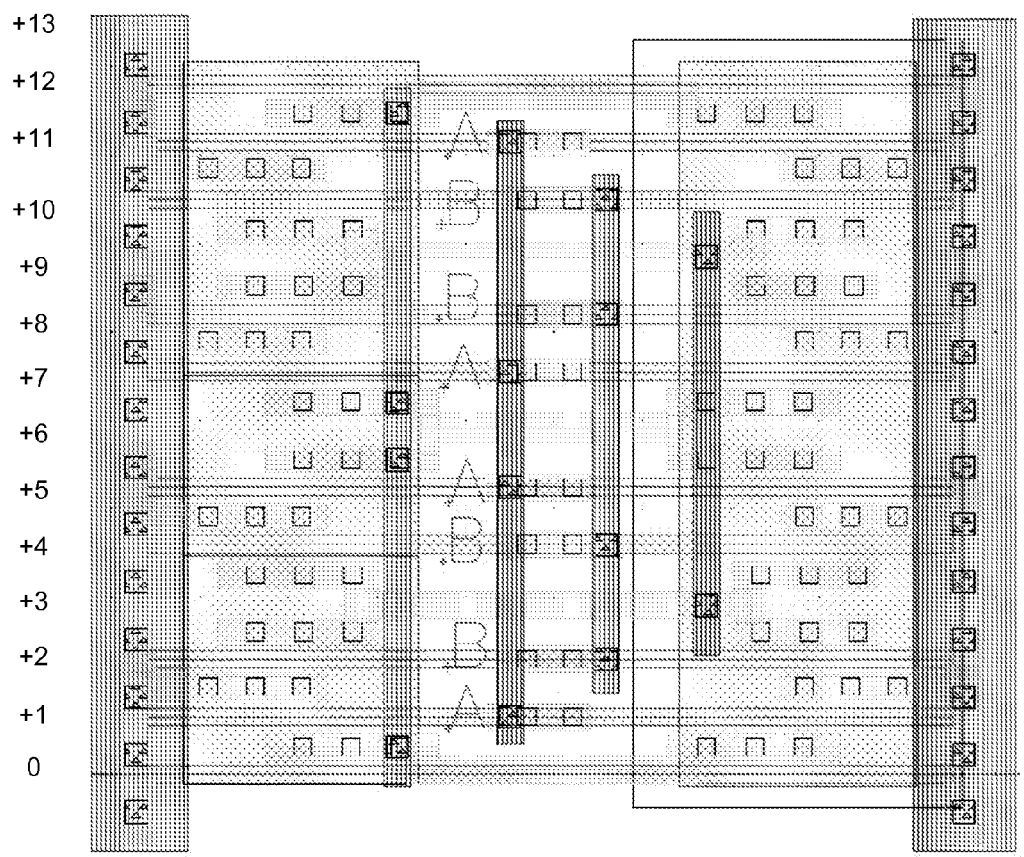
Figure 4C:
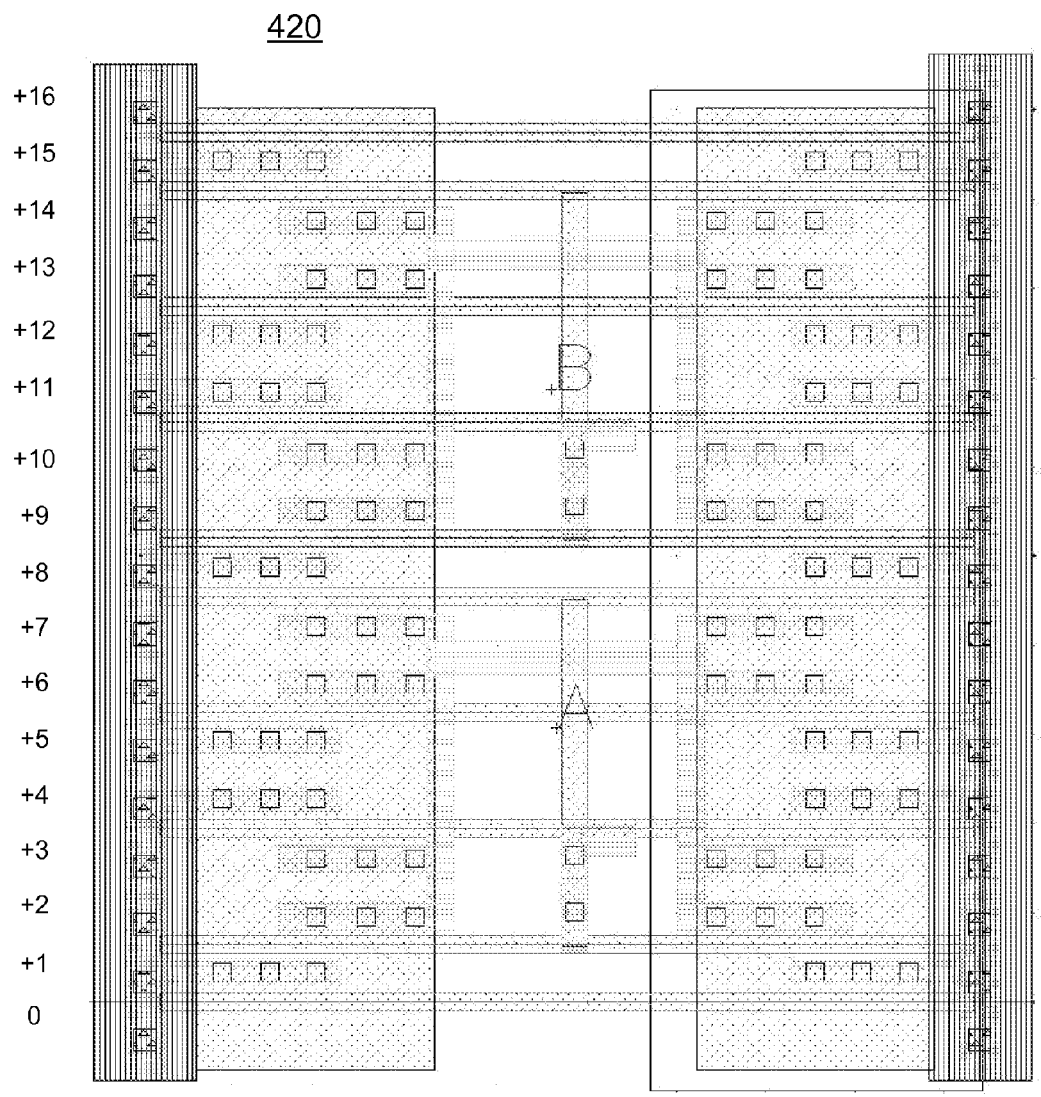

Referring to FIGS. 4A, 4B and 4C there are shown exemplary circuit library layouts or books for respective example inverters for implementing multiple mask lithography timing variation mitigation in accordance with the preferred embodiment. The new standard cell library 128 is used with the method of the invention to minimize the layout impact of having circuits on two or more different phase.

In FIG. 4A, an example original circuit library layout book generally designated by the reference character 400 is shown for a pair of inverters including 8 PC tracks.

In FIG. 4B, an example original circuit library layout book generally designated by the reference character 410 is shown for a pair of interleaved inverters with all fingers of a given inverter on the same phase including 11 PC tracks.

In FIG. 4C, an example original circuit library layout book generally designated by the reference character 420 is shown for a pair of stacked inverters with skip PC tracks to put all fingers of a given inverter on the same phase including 14 PC tracks.

Figure 5A:
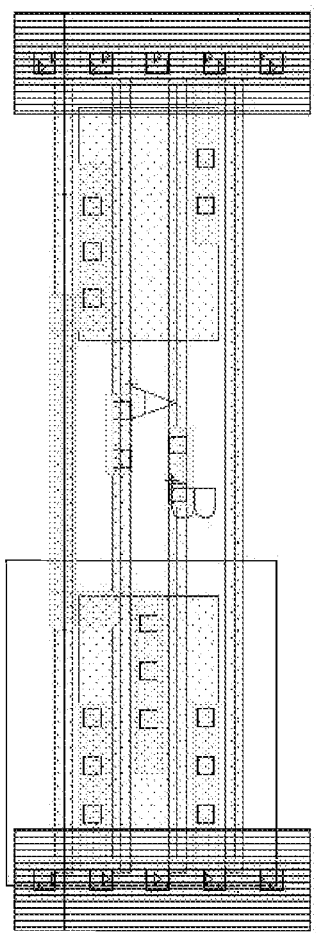
FIGS. 5A, and 5B respectively illustrate exemplary cell library layout books for example NAND gates for implementing multiple mask lithography timing variation mitigation in accordance with the preferred embodiment.
Figure 5B:
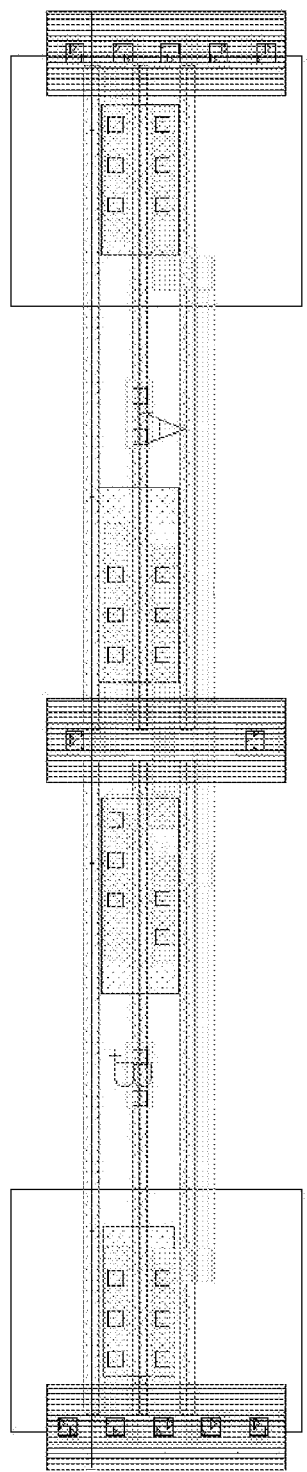

Referring to FIGS. 5A, and 5B respectively illustrate exemplary cell library layout books for example NAND gates for implementing multiple mask lithography timing variation mitigation in accordance with the preferred embodiment.

In FIG. 5A, an example original circuit library layout book generally designated by the reference character 500 is shown for an original NAND gate.

In FIG. 5B, an example circuit library layout books generally designated by the reference character 510 is shown for a NAND gate a spread out in the X-direction.

In accordance with features of the invention, the result of using the algorithm or method of the invention which takes advantage of the phase A and phase B variation relationship, allows for improved timing and faster chips.

Figure 6:
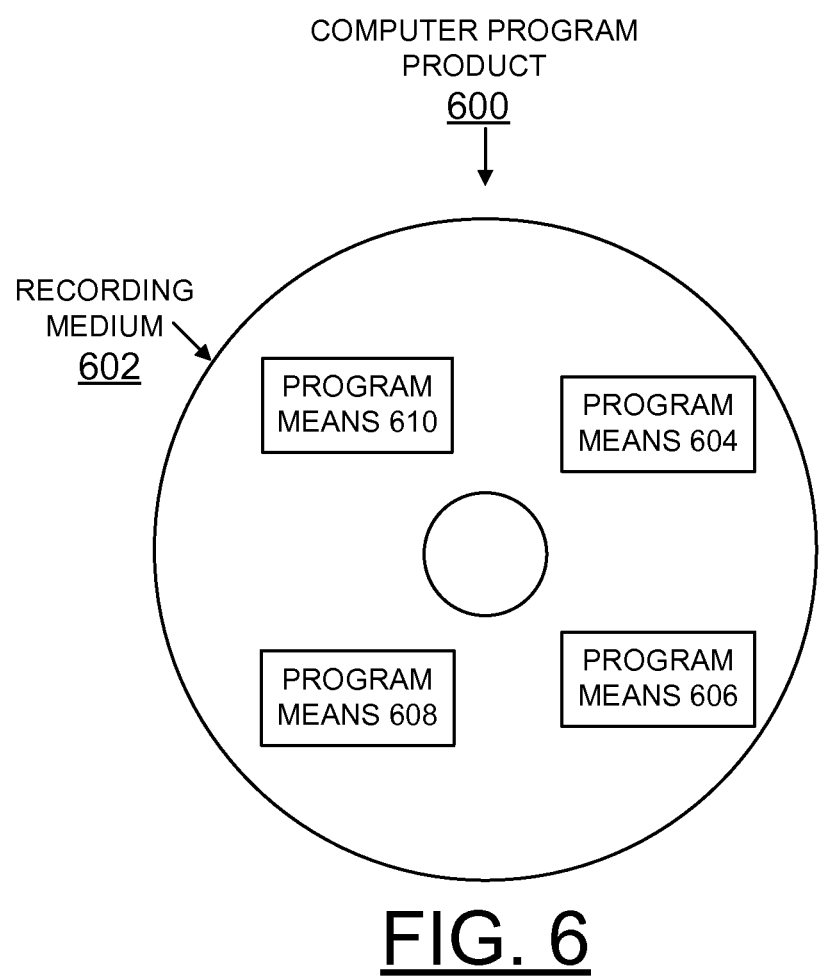
FIG. 6 is a block diagram illustrating a computer program product in accordance with the preferred embodiment.

Referring now to FIG. 6, an article of manufacture or a computer program product 600 of the invention is illustrated. The computer program product 600 is tangibly embodied in a non-transitory machine readable recording medium 602, such as, a floppy disk, a high capacity read only memory in the form of an optically read compact disk or CD-ROM, a tape, or another similar computer program product. Recording medium 602 stores program means 604, 606, 608, 610 on the medium 602 for carrying out the methods for implementing multiple mask lithography timing variation mitigation of an integrated circuit of the preferred embodiment in the system 100 of FIGS. 1 and 2.

A sequence of program instructions or a logical assembly of one or more interrelated modules defined by the recorded program means 604, 606, 608, 610; direct the computer system 100 for implementing multiple mask lithography timing variation mitigation of the preferred embodiment.

While the present invention has been described with reference to the details of the embodiments of the invention shown in the drawing, these details are not intended to limit the scope of the invention as claimed in the appended claims.

What is claimed is:

1. A computer-implemented method for implementing multiple mask lithography timing variation mitigation of an integrated circuit design comprising:
   providing an application specific integrated circuit (ASIC) library including at least one circuit device on a first mask, and at least one circuit device on a second mask by using a computer;
   identifying first circuit devices from said ASIC library in critical early mode paths and second circuit devices from said ASIC library in critical late mode paths in a circuit design;
   for identified first circuit devices in the critical early mode paths, placing the first circuit devices in the critical early mode paths on a single mask of either the first mask or the second mask; and
   for identified second circuit devices in the critical late mode paths, providing the identified second circuit devices in the critical late mode paths from the first mask and the second mask by moving the identified second circuit devices in the late mode paths to provide an even distribution of the second circuit devices between the first mask and the second mask.

2. The computer-implemented method as recited in claim 1 wherein providing said application specific integrated circuit (ASIC) library including at least one circuit device on a first mask, and at least one circuit device on a second mask includes providing predefined assigned gates for each of said first mask and said second mask.

3. The computer-implemented method as recited in claim 1 wherein identifying first circuit devices from said ASIC library in critical early mode paths and second circuit devices from said ASIC library in critical late mode paths in a circuit design includes performing a timing analysis for the circuit design for identifying critical early mode paths and critical late mode paths.

4. The computer-implemented method as recited in claim 1 wherein, for identified first circuit devices in the critical early mode paths, placing the first circuit devices in the critical early mode paths on a single mask of either the first mask or the second mask includes placing each path and all associated circuit devices in the critical early mode paths on either the first mask or the second mask.

5. The computer-implemented method as recited in claim 4 includes removing a timing variation margin penalty responsive to all circuit devices in the critical early mode paths being placed on the single mask.

6. The computer-implemented method as recited in claim 1 wherein, for identified first circuit devices in the critical early mode paths, placing the first circuit devices in the critical early mode paths on a single mask of either the first mask or the second mask includes swapping books in the critical early mode paths with books exclusively from the first mask library or the second mask library.

7. The computer-implemented method as recited in claim 1 wherein, for identified second circuit devices in the critical late mode paths, providing the identified second of circuit devices in the critical late mode paths from the first mask and the second mask includes swapping books in the critical late mode paths with books evenly distributed from the first mask and the second mask.

8. An integrated circuit design computer program product for implementing multiple mask lithography timing variation mitigation of an integrated circuit design in a computer system, said computer program product tangibly embodied in a non-transitory machine readable medium used in the integrated circuit design process, said integrated circuit design computer program product including a circuit macro timing tool and a circuit device placement tool, said integrated circuit design computer program product including instructions executed by the computer system to cause the computer system to perform the steps of:

provi ding an application specific integrated circuit (ASIC) library including at least one circuit device on a first mask, and at least one circuit device on a second mask;

identifying first circuit devices from said ASIC library in critical early mode paths and second circuit devices from said ASIC library in critical late mode paths in a circuit design;

for identified first circuit devices in the critical early mode paths, placing the first circuit devices in the critical early mode paths on a single mask of either the first mask or the second mask; and for identified second circuit devices in the critical late mode paths, providing the identified second circuit devices in the critical late mode paths from the first mask and the second mask by moving the identified second circuit devices in the late mode paths to provide an even distribution of the second circuit devices between the first mask and the second mask.

9. The integrated circuit design computer program product as recited in claim 8 wherein providing said application specific integrated circuit (ASIC) library including at least one circuit device on a first mask, and at least one circuit device on a second mask includes providing predefined assigned gates for each of said first mask and said second mask.

10. The integrated circuit design computer program product as recited in claim 8 wherein first circuit devices from said ASIC library in critical early mode paths and second circuit devices from said ASIC library in critical late mode paths in a circuit design includes performing a timing analysis for the circuit design for identifying critical early mode paths and critical late mode paths.

11. The integrated circuit design computer program product as recited in claim 8 wherein, for identified first circuit devices in the critical early mode paths, placing the first circuit devices in the critical early mode paths on a single mask of either the first mask or the second mask includes placing each path and all associated circuit devices in the critical early mode paths on either the first mask or the second mask removing a timing variation margin penalty responsive to all circuit devices in the critical early mode paths being placed on the single mask.

12. The integrated circuit design computer program product as recited in claim 8 wherein, for identified second circuit devices in the critical late mode paths, providing the identified second circuit devices in the critical late mode paths from the first mask and the second mask includes swapping books in the critical late mode paths with books evenly distributed from the first mask and the second mask.

13. A system for implementing multiple mask lithography timing variation mitigation of an integrated circuit design comprising:

a processor, an integrated circuit design program tangibly embodied in a machine readable medium used in the integrated circuit design process, said integrated circuit design program including a circuit macro timing tool and a circuit device placement tool, an application specific integrated circuit (ASIC) library including at least one circuit device on a first mask, and at least one circuit device on a second mask;

said processor using said circuit macro timing tool and said circuit device placement tool, identifying first circuit devices from said ASIC library in critical early mode paths and second circuit devices from said ASIC library in critical late mode paths in a circuit design;

said processor, for identified first circuit devices in the critical early mode paths, placing the first circuit devices in the critical early mode paths on a single mask of either the first mask or the second mask; and said processor, for identified second circuit devices in the critical late mode paths, providing the identified second circuit devices in the critical late mode paths from the first mask and the second mask by moving the identified second circuit devices in the late mode paths to provide an even distribution of the second circuit devices between the first mask and the second mask.

14. The system as recited in claim 13 wherein said processor identifying first circuit devices from said ASIC library in critical early mode paths and second circuit devices from said ASIC library in critical late mode paths in a circuit design includes said processor performing a timing analysis for the circuit design for identifying critical early mode paths and critical late mode paths.

15. The system as recited in claim 13 wherein said processor, for identified first circuit devices in the critical early mode paths, placing the first circuit devices in the critical early mode paths on a single mask of either the first mask or the second mask includes said processor swapping books in the critical early mode paths with books exclusively from the first mask library or the second mask library.

16. The system as recited in claim 13 wherein said processor, for identified first circuit devices in the critical early mode paths, placing the first circuit devices in the critical early mode paths on a single mask of either the first mask or the second mask includes said processor placing each path and all associated circuit devices in the critical early mode paths on either the first mask or the second mask removing a timing variation margin penalty responsive to all circuit devices in the critical early mode paths being placed on the single mask.

17. The system as recited in claim 13 wherein said processor, for identified second circuit devices in the critical late mode paths, providing the identified second circuit devices in the critical late mode paths from the first mask and the second mask includes said processor swapping books in the critical late mode paths with books evenly distributed from the first mask and the second mask.

* * * * *